United States Patent
Lin

(10) Patent No.: US 7,491,593 B2
(45) Date of Patent: Feb. 17, 2009

(54) TFT ARRAY SUBSTRATE AND PHOTO-MASKING METHOD FOR FABRICATING SAME

(75) Inventor: Yao-Nan Lin, Miao-Li (TW)

(73) Assignee: Innolux Display Corp., Miao-Li County (TW)

( * ) Notice: Subject to any disclaimer, the term of this patent is extended or adjusted under 35 U.S.C. 154(b) by 0 days.

(21) Appl. No.: 11/595,374

(22) Filed: Nov. 10, 2006

(65) Prior Publication Data
US 2007/0105290 A1    May 10, 2007

(30) Foreign Application Priority Data
Nov. 10, 2005    (CN) .................. 2005 1 0101208

(51) Int. Cl.
*H01L 31/113*    (2006.01)

(52) U.S. Cl. .................. 438/182; 438/151; 438/158; 257/59; 257/72; 257/291; 257/E27.111; 257/E27.113; 257/E29.278

(58) Field of Classification Search .................. 43/151, 43/158, 182; 257/291, 72, 59
See application file for complete search history.

(56) References Cited

U.S. PATENT DOCUMENTS

| | | | |
|---|---|---|---|
| 5,926,702 A | 7/1999 | Kwon et al. | |
| 2005/0046762 A1 | 3/2005 | Kim et al. | |
| 2005/0101044 A1 * | 5/2005 | Cho et al. | 438/30 |
| 2006/0141643 A1 * | 6/2006 | Shih | 438/22 |
| 2007/0145436 A1 * | 6/2007 | Lin | 257/288 |

FOREIGN PATENT DOCUMENTS

WO    WO2004/057416 A1    7/2004

* cited by examiner

*Primary Examiner*—Ahmed Sefer
(74) *Attorney, Agent, or Firm*—Wei Te Chung

(57) ABSTRACT

An exemplary method for fabricating a thin film transistor array substrate (200) includes: providing an insulating substrate (201); coating a transparent conductive layer (202) and a gate metal layer (203) on the substrate; forming a gate electrode (213) and a pixel electrode (212) using a first photo-mask process; forming a gate insulating layer (204), an amorphous silicon layer (205), a doped amorphous silicon layer (206), and a source/drain metal layer (207) on the substrate; forming a plurality of source electrodes (227) and a plurality of drain electrodes (228) using a second photo-mask process; depositing a metal layer (208) on the substrate and the pixel electrodes; and forming a passivation layer (209) on the source electrodes, the drain electrodes and the channels and a plurality of metal contact layers (218) using a third photo-mask process.

9 Claims, 6 Drawing Sheets

TFT ARRAY SUBSTRATE AND PHOTO-MASKING METHOD FOR FABRICATING SAME

FIELD OF THE INVENTION

The present invention relates to thin film transistor (TFT) array substrates used in liquid crystal displays (LCDs) and methods of fabricating these substrates, and particularly to a TFT array substrate and a method for fabricating the substrate which efficiently uses minimal photo-masking.

GENERAL BACKGROUND

A typical liquid crystal display (LCD) is capable of displaying a clear and sharp image through millions of pixels that make up the complete image. The liquid crystal display has thus been applied to various electronic equipment in which messages or pictures need to be displayed, such as mobile phones and notebook computers. A liquid crystal panel is a major component of the LCD, and generally includes a thin film transistor (TFT) array substrate, a color filter substrate opposite to the TFT array substrate, and a liquid crystal layer sandwiched between the two substrates.

Referring to FIG. 19, part of a typical TFT array substrate is shown. The TFT array substrate 100 includes a substrate 101, a gate electrode 102 formed on the substrate 101, a gate insulating layer 103 formed on the substrate 101 having the gate electrode 102, a semiconductor layer 104 formed on the gate insulating layer 103, a source electrode 105 and a drain electrode 106 formed on the gate insulating layer 103 and the semiconductor layer 104, a passivation layer 107 formed on the gate insulating layer 103, the source electrode 105 and the drain electrode 106, and a pixel electrode 108 formed on the passivation layer 107.

Referring to FIG. 20, this is a flowchart summarizing a typical method for fabricating the TFT array substrate 100. For simplicity, the flowchart and the following description are couched in terms that relate to the part of the TFT array substrate 100 shown in FIG. 19. The method includes: step S10, forming a gate metal layer; step S11, forming a gate electrode; step S12, forming a gate insulating layer and an amorphous silicon (a-Si) and doped a-Si layer; step S13, forming a semiconductor layer on the gate insulating layer; step S14, forming a source/drain metal layer; step S15, forming source/drain electrodes; step S16, forming a passivation material layer; step S17, forming a passivation layer; step S18, forming a transparent conductive layer; and step S19, forming a pixel electrode.

In step S10, an insulating substrate is provided. The substrate may be made from glass or quartz. A gate metal layer and a first photo-resist layer are formed on the substrate.

In step S11, the first photo-resist layer is exposed by a first photo-mask, and then is developed, thereby forming a first photo-resist pattern. The gate metal layer is etched, thereby forming a pattern of the gate electrode 102, which corresponds to the first photo-resist pattern. The residual first photo-resist layer is then removed by an acetone solution.

In step S12, a gate insulating layer 103, an a-Si and doped a-Si layer, and a second photo-resist layer are sequentially formed on the substrate 101 having the gate electrode 102.

In step S13, the second photo-resist layer is exposed by a second photo-mask, and then is developed, thereby forming a second photo-resist pattern. The a-Si and doped a-Si layer is etched, thereby forming a pattern of the semiconductor layer 104, which corresponds to the second photo-resist pattern. The residual second photo-resist layer is then removed by an acetone solution.

In step S14, a source/drain metal layer and a third photo-resist layer are sequentially formed on the semiconductor layer 104.

In step S15, the third photo-resist layer is exposed by a third photo-mask, and then is developed, thereby forming a third photo-resist pattern. The source/drain metal layer is etched, thereby forming a pattern of the source electrode 105 and the drain electrode 106, which corresponds to the third photo-resist pattern. The residual third photo-resist layer is then removed by an acetone solution.

In step S16, a passivation material layer and a fourth photo-resist layer are sequentially formed on the substrate 101 having the three electrodes 102, 105, 106 formed thereon.

In step S17, the fourth photo-resist layer is exposed by a fourth photo-mask, and then is developed, thereby forming a fourth photo-resist pattern. The passivation material layer is etched, thereby forming a pattern of the passivation layer 107, which corresponds to the fourth photo-resist pattern. The residual fourth photo-resist layer is then removed by an acetone solution.

In step S18, a transparent conductive layer and a fifth photo-resist layer are sequentially formed on the passivation layer 107.

In step S19, the fifth photo-resist layer is exposed by a fifth photo-mask, and then is developed, thereby forming a fifth photo-resist pattern. The transparent conductive layer is etched, thereby forming a pattern of the pixel electrode 108, which corresponds to the fifth photo-resist pattern. The residual fifth photo-resist layer is then removed by an acetone solution.

The method includes five photo-mask processes, each of which is rather complicated and costly. Thus, the method for fabricating the TFT array substrate 100 is correspondingly complicated and costly.

What is needed, therefore, is a method for fabricating a TFT array substrate that can overcome the above-described problems. What is also needed is a TFT array substrate fabricated by the above method.

SUMMARY

In one preferred embodiment, a method for fabricating a thin film transistor array substrate includes: providing an insulating substrate; coating a transparent conductive layer and a gate metal layer on the substrate; forming a plurality of gate electrodes and a plurality of pixel electrodes using a first photo-mask process; forming a gate insulating layer, an amorphous silicon layer, a doped amorphous silicon layer, and a source/drain metal layer on the substrate having the gate electrodes and the pixel electrodes; forming a plurality of source electrodes and a plurality of drain electrodes using a second photo-mask process, each of pairs of one source electrode and one drain electrode defining a channel therebetween; depositing a metal layer on the substrate and the pixel electrodes; depositing a passivation material layer on the source electrodes, the drain electrodes, the channels, and the metal layer; and forming a passivation layer on the source electrodes, the drain electrodes and the channels and a plurality of metal contact layers using a third photo-mask process, each of the metal contact layers interconnecting a corresponding pair of one drain electrode and one pixel electrode.

Other advantages and novel features will become more apparent from the following detailed description when taken in conjunction with the accompanying drawings.

DETAILED DESCRIPTION OF PREFERRED EMBODIMENTS

Figure 1:
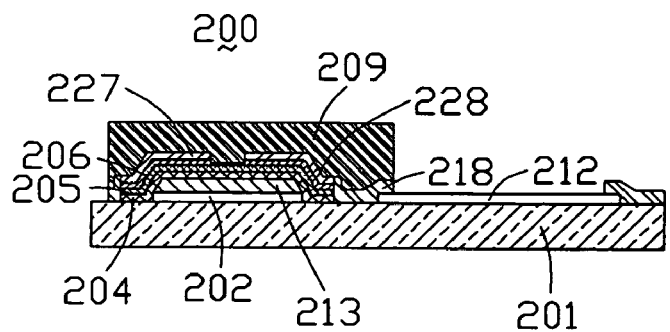
FIG. 1 is a schematic, side cross-sectional view of part of a TFT array substrate according to an exemplary embodiment of the present invention.

Referring to FIG. 1, part of a thin film transistor (TFT) array substrate according to an exemplary embodiment of the present invention is shown. The TFT array substrate 200 includes an insulating substrate 201, a pixel electrode 212 and a transparent conductive layer 202 formed on the substrate 201, a gate electrode 213 formed on the transparent conductive layer 202, a gate insulating layer 204 formed on the gate electrode 213, an a-Si layer 205 formed on the gate insulating layer 204, a doped a-Si layer 206 formed on the a-Si layer 205, a source electrode 227 and a drain electrode 228 formed on the doped a-Si layer 206, a metal contact layer 218 connecting the pixel electrode 212 and the drain electrode 228, and a passivation layer 209 formed on the source electrode 227, the drain electrode 228 and the metal contact layer 218.

Figure 2:
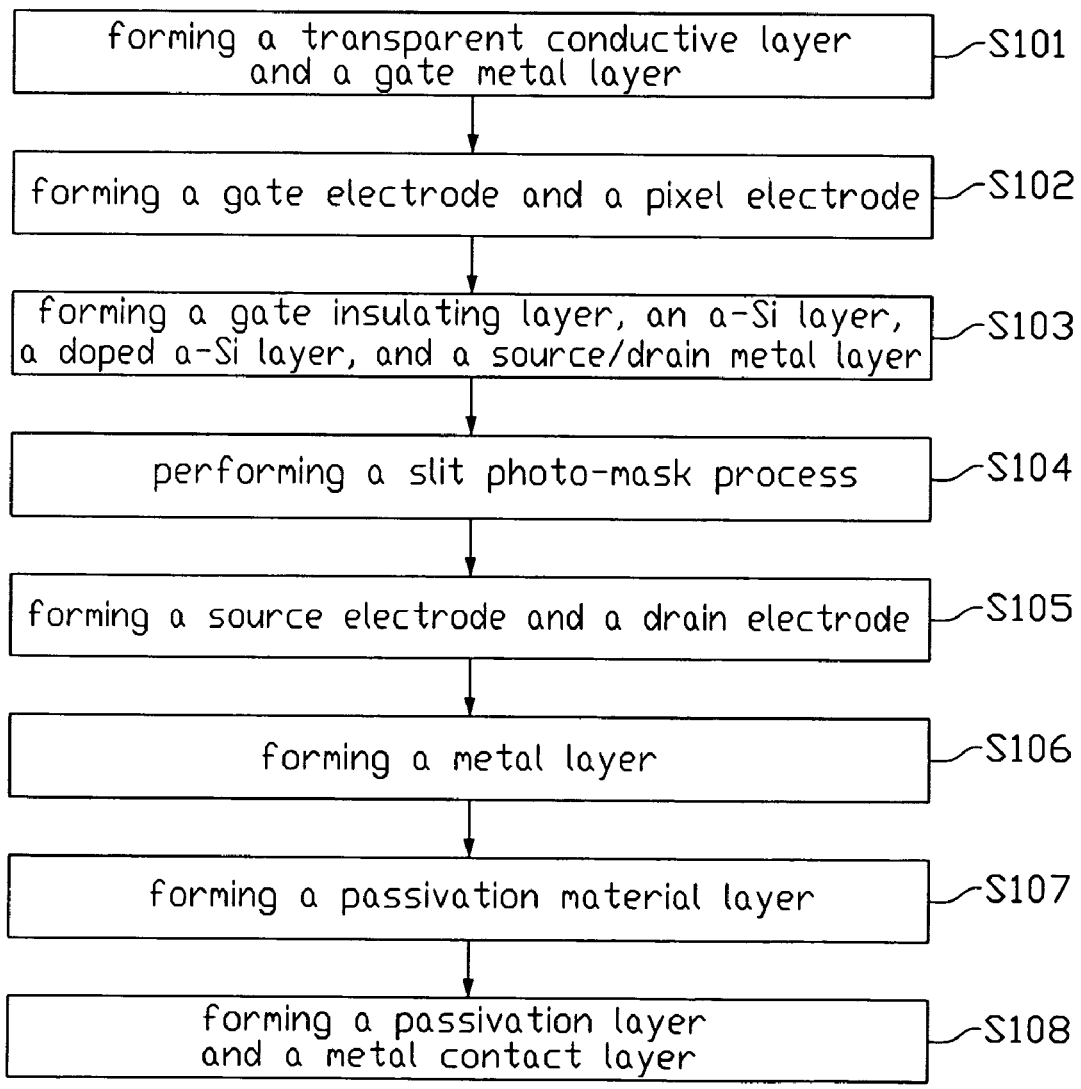
FIG. 2 is a flowchart summarizing an exemplary method for fabricating the TFT array substrate of FIG. 1.

Referring to FIG. 2, this is a flowchart summarizing an exemplary method for fabricating the TFT array substrate 200. For simplicity, the flowchart and the following description are couched in terms that relate to the part of the TFT array substrate 200 shown in FIG. 1. The method includes: step S101, forming a transparent conductive layer and a gate metal layer; step S102, forming a gate electrode and a pixel electrode; step S103, forming a gate insulating layer, an amorphous silicon (a-Si) layer, a doped a-Si layer, and a source/drain metal layer; step S104, performing a slit photo-mask process; step S105, forming a source electrode and a drain electrode; step S106, forming a metal layer; step S107, forming a passivation material layer; and step S108, forming a passivation layer and a metal contact layer.

Figure 3:
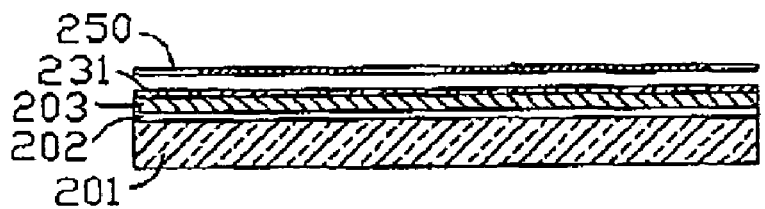
FIG. 3 is a schematic, side cross-sectional view relating to a step of providing a substrate and forming a transparent conductive layer, a gate metal layer and a first photo-resist layer on the substrate according to the method of FIG. 2.

In step S101, referring to FIG. 3, an insulating substrate 201 is provided. The substrate 201 may be made from glass or quartz. A transparent conductive layer 202, a gate metal layer 203, and a first photo-resist layer 231 are sequentially formed on the substrate 201. The transparent conductive layer 202 may be made from indium tin oxide (ITO) or indium zinc oxide (IZO). The gate metal layer 203 may be made from material including any one or more items selected from the group consisting of aluminum (Al), molybdenum (Mo), copper (Cu), chromium (Cr), and tantalum (Ta).

Figure 4:
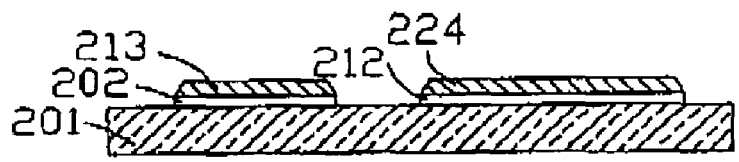
FIG. 4 is a schematic, side cross-sectional view relating to a next step of forming a gate electrode and a pixel electrode according to the method of FIG. 2.

In step S102, a light source (not shown) and a first photo-mask 250 are used to expose the first photo-resist layer 231. Then the exposed first photo-resist layer 231 is developed, thereby forming a first photo-resist pattern. Using the first photo-resist pattern as a mask, the gate metal layer 203 and the transparent conductive layer 202 are etched, thereby forming the gate electrode 213 and the pixel electrode 212, as shown in FIG. 4. A residual gate metal layer 224 is positioned on the pixel electrode 212. The residual transparent conductive layer 202 is positioned beneath the gate electrode 213. The residual first photo-resist layer 231 is then removed by an acetone solution, and the substrate 201 is cleaned and dried.

Because the gate metal layer 203 and the transparent conductive layer 202 are adjacent each other, and the gate electrode 213 and the pixel electrode 212 do not overlap each other, only one photo-mask process is needed to form the gate electrode 213 and the pixel electrode 212. Compared to the above-described conventional method, one photo-mask process is saved, thus providing a simplified method and decreasing costs.

Figure 5:
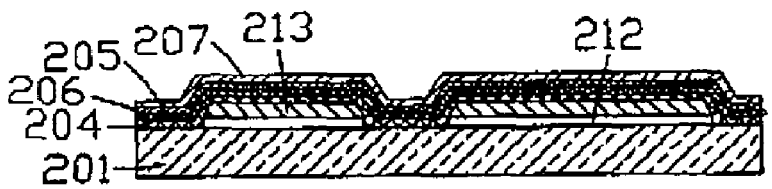
FIG. 5 is a schematic, side cross-sectional view relating to a next step of forming a gate insulating layer, an amorphous silicon (a-Si) and doped a-Si layer, and a source/drain metal layer on the substrate having the gate electrode and the pixel electrode according to the method of FIG. 2.

In step S103, referring to FIG. 5, a gate insulating layer 204 is formed on the substrate 201 having the gate electrode 213 and the pixel electrode 212 by a chemical vapor deposition (CVD) process. In this process, silane ($SiH_4$) reacts with alkaline air ($NH_4^+$) to obtain silicon nitride ($SiN_x$), a material of the gate insulating layer 204. An amorphous silicon (a-Si) material layer is deposited on the gate insulating layer 204 by a CVD process. The a-Si layer is doped, thereby respectively forming an a-Si layer 205 and a doped a-Si layer 206. A source/drain metal layer 207 is then deposited on the doped a-Si layer 206. The source/drain metal layer 207 may be made from material including any one or more items selected from the group consisting of aluminum, aluminum alloy, molybdenum, tantalum, and molybdenum-tungsten alloy.

Figure 6:
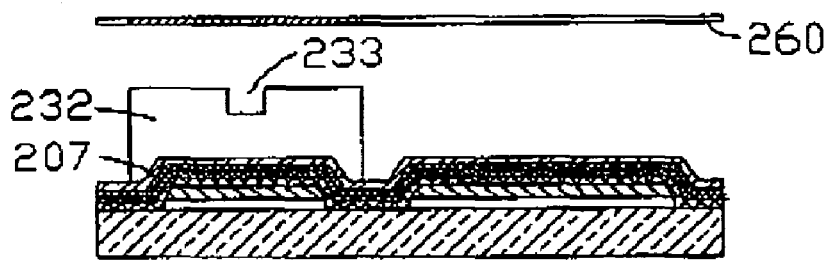
FIG. 6 is a schematic, side cross-sectional view relating to a next step of exposing a second photo-resist layer using a slit photo-mask according to the method of FIG. 2.

In step S104, a second photo-resist layer is coated on the source/drain metal layer 207. A light source and a photo-mask 260 with a slit are used to expose the second photo-resist layer. Then the exposed second photo-resist layer is developed, thereby forming a second photo-resist pattern 232 having a groove 233, as shown in FIG. 6. A thickness of the second photo-resist pattern 232 beneath the groove 233 is less than a thickness of other portions of the second photo-resist pattern 232.

In an alternative embodiment, a photo-mask having transparent portions, opaque portions and semitransparent portions may be used to expose the second photo-resist layer in order to produce the second photo-resist pattern 232 having the groove 233. In another alternative embodiment, a light diffraction technique may also be used to produce the groove 233.

Figure 7:
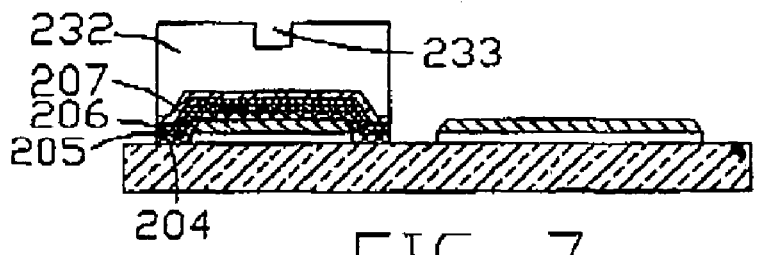
FIG. 7 is a schematic, side cross-sectional view relating to a next step of forming a gate insulating pattern, an a-Si pattern, a doped a-Si pattern, and a source/drain pattern according to the method of FIG. 2.

Referring to FIG. 7, using the second photo-resist pattern 232 having the groove 233 as a mask, portions of the gate insulating layer 204, the a-Si layer 205, the doped a-Si layer 206 and the source/drain metal layer 207 which are not covered by the second photo-resist pattern 232 are etched away.

Figure 8:
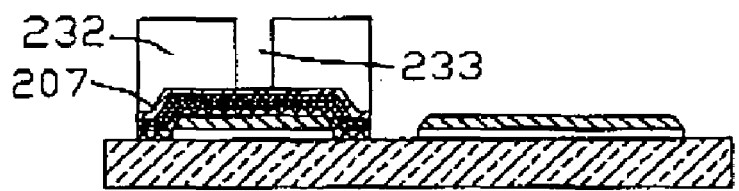
FIG. 8 is a schematic, side cross-sectional view relating to a next step of removing the second photo-resist layer at a groove thereof according to the method of FIG. 2.

Referring to FIG. 8, a photo-mask having a transparent portion corresponding to a portion of the second photo-resist pattern 232 beneath the groove 233 is used to expose the second photo-resist pattern 232. Then the second photo-resist pattern 232 is developed, whereby the portion of the second photo-resist pattern 232 beneath the groove 233 is removed by an acetone solution to expose the source/drain metal layer 207 immediately beneath the groove 233.

Figure 9:
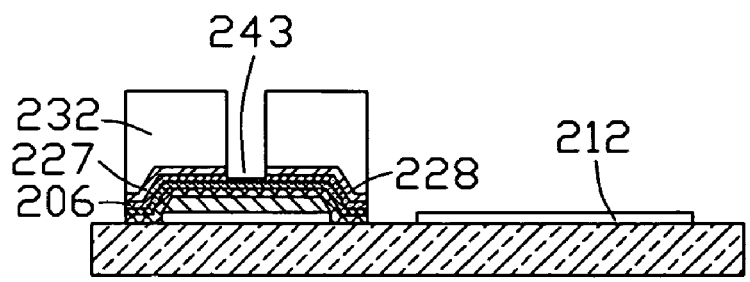
FIG. 9 is a schematic, side cross-sectional view relating to a next step of forming a source electrode, a drain electrode, and a channel between the two electrodes according to the method of FIG. 2.

In step S105, referring to FIG. 9, the source/drain metal layer 207 and a part of the doped a-Si layer 206 beneath the groove 233 are etched, thereby forming the source electrode 227, the drain electrode 228, and a channel 243 defined between the two electrodes 227, 228. At the same time, the residual gate metal layer 224 on the pixel electrode 212 is completely etched away.

Because the doped a-Si layer 206 and the source/drain metal layer 207 are positioned adjacent to each other, only one photo-mask process is needed to form the source electrode 227, the drain electrode 228 and the channel 243. Compared to the above-described conventional method, another photo-mask process is saved, thus providing a further simplified method and further decreasing costs.

Figure 10:
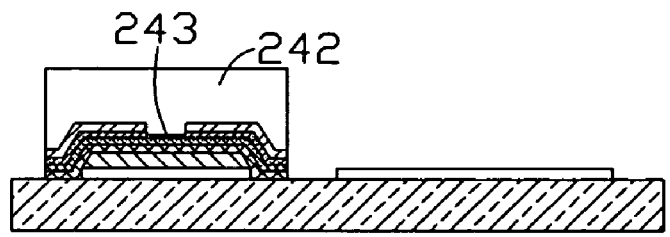
FIG. 10 is a schematic, side cross-sectional view relating to a next step of melting the second photo-resist layer according to the method of FIG. 2.

In step S106, referring to FIG. 10, the second photo-resist pattern 232 is molten, whereby the channel 243 is filled in, thereby forming a third photo-resist layer 242 having a planar surface.

Figure 11:
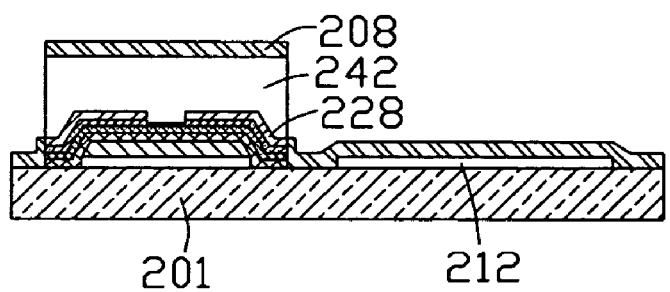
FIG. 11 is a schematic, side cross-sectional view relating to a next step of depositing a metal layer on the exposed substrate, the pixel electrode and the photo-resist layer according to the method of FIG. 2.

Referring to FIG. 11, a metal layer 208 having a uniform thickness is deposited on the exposed substrate 201, the pixel electrode 212 and the third photo-resist layer 242.

Figure 12:
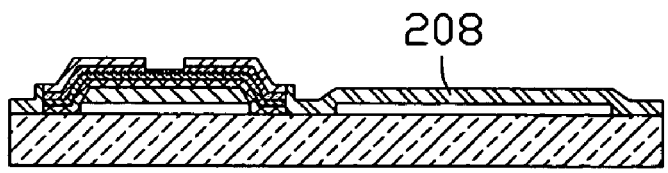
FIG. 12 is a schematic, side cross-sectional view relating to a next step of forming a metal contact layer connected with the pixel electrode and the drain electrode according to the method of FIG. 2.

Referring to FIG. 12, the third photo-resist layer 242 is removed by an acetone solution, whereupon the metal layer 208 formed on the third photo-resist layer 242 is stripped off.

Figure 13:
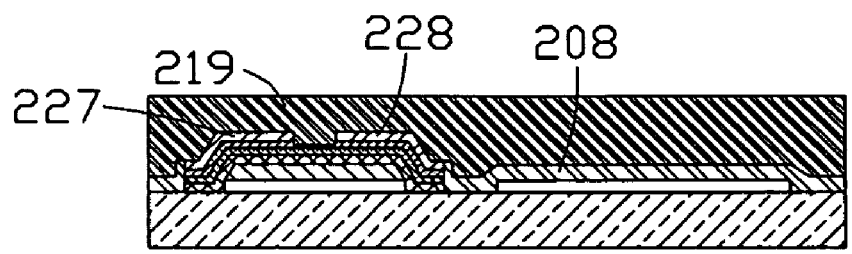
FIG. 13 is a schematic, side cross-sectional view relating to a next step of depositing a passivation layer on the source electrode, the drain electrode and the metal contact layer according to the method of FIG. 2

In step S107, referring to FIG. 13, a passivation material layer 219 is deposited on the source electrode 227, the drain electrode 228 and the metal layer 208.

Figure 14:
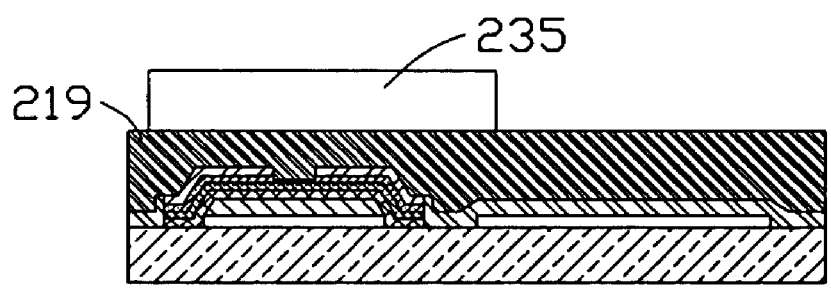
FIG. 14 is a schematic, side cross-sectional view relating to a next step of coating a third photo-resist layer on the passivation layer according to the method of FIG. 2.
Figure 15:
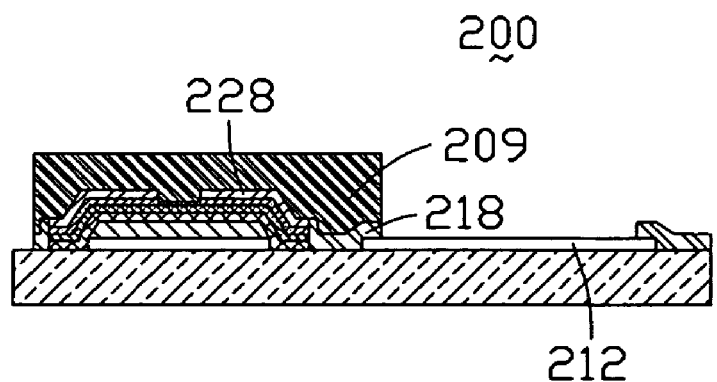
FIG. 15 is a schematic, side cross-sectional view relating to a next step of etching the passivation layer and the metal contact layer according to the method of FIG. 2.

In step S108, referring to FIG. 14, a fourth photo-resist layer is coated on the passivation material layer 219. A light source and a third photo-mask (not labeled) are used to expose the fourth photo-resist layer, thereby forming a fourth photo-resist pattern 235. Referring also to FIG. 15, a portion of the passivation material layer 219 not covered by the fourth photo-resist pattern 235 and a corresponding portion of the metal layer 208 beneath said portion of the passivation material layer 219 are both etched away; thereby forming a passivation layer 209, and a metal contact layer 218 connecting the drain electrode 228 and the pixel electrode 212. The fourth photo-resist pattern 235 is then removed by an acetone solution. Thus the TFT array substrate 200 is obtained.

In summary, compared to the above-described conventional method, in the above-described exemplary method for fabricating the TFT array substrate 200, only one photo-mask process is used to form the gate electrode 213 and the pixel electrode 212, and only one photo-mask process is used to form the source electrode 227 and the drain electrode 228, thus saving two photo-mask processes. That is, the method for fabricating the TFT array substrate 200 only includes a total of three photo-mask processes. Therefore, a simplified method at a reduced cost is provided.

Figure 16:
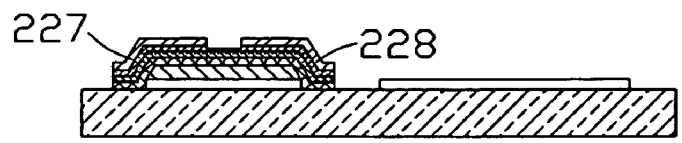
FIG. 16 is a schematic, side cross-sectional view relating to a step of removing the second photo-resist layer having the channel after the step of FIG. 9 according to an alternative method for fabricating the TFT array substrate of FIG. 1.
Figure 17:
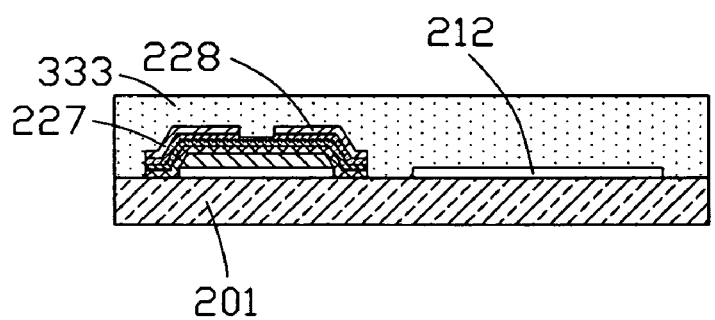
FIG. 17 is a schematic, side cross-sectional view relating to a next step of coating a fourth photo-resist layer on the source electrode, the drain electrode, the pixel electrode and the exposed substrate according to the alternative method of FIG. 16.
Figure 18:
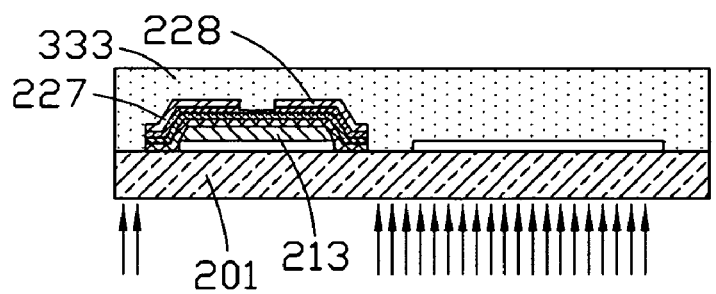
FIG. 18 is a schematic, side cross-sectional view relating to a next step of exposing the fourth photo-resist layer according to the alternative method of FIG. 16.
Figure 19:
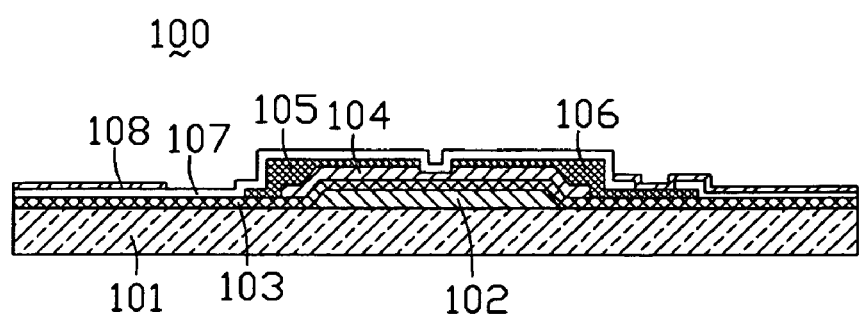
FIG. 19 is a schematic, side cross-sectional view of part of a conventional TFT array substrate.
Figure 20:
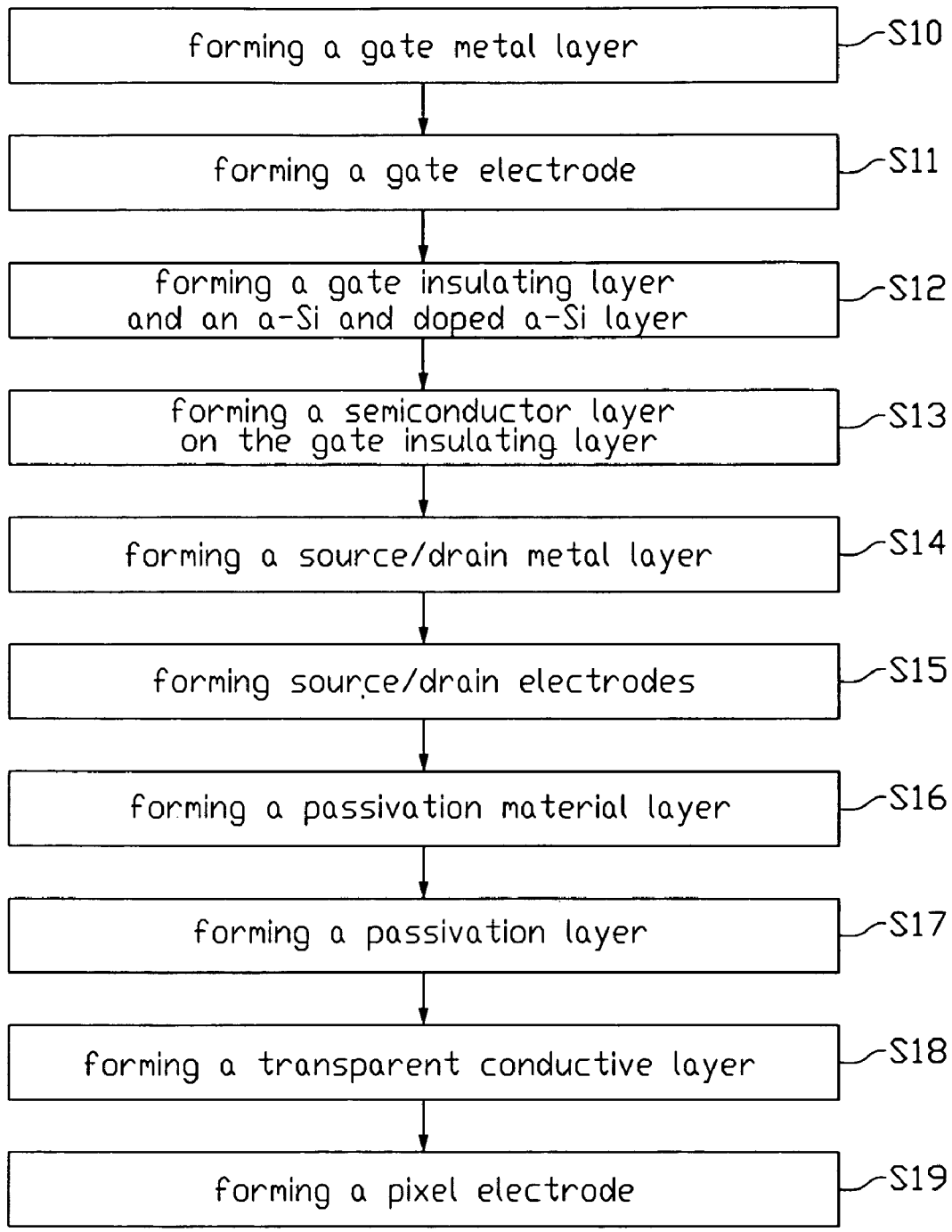
FIG. 20 is a flowchart summarizing a conventional method for fabricating the TFT array substrate of FIG. 19.

In an alternative method, the following steps can be performed instead of step S106 described above. Referring to FIG. 16, the second photo-resist pattern 232 is completely removed by an acetone solution, thereby exposing the source electrode 227 and the drain electrode 228. Referring to FIG. 17, a fifth photo-resist layer 333 is coated on the source electrode 227, the drain electrode 228, the pixel electrode 212 and the exposed substrate 201. Referring to FIG. 18, using the source electrode 227, the drain electrode 228 and the gate electrode 213 as masks, light beams from a light source (not shown) under the substrate 201 irradiate exposed portions of the fifth photo-resist layer 333. The exposed portions of the fifth photo-resist layer 333 are then developed. Thereby, a photo-resist layer equivalent to the third photo-resist layer 242 having the planar surface is formed (see FIG. 10).

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A method for fabricating a thin film transistor (TFT) array substrate, the method comprising:
    providing an insulating substrate;
    coating a transparent conductive layer and a gate metal layer on the substrate;
    forming a gate electrode and a pixel electrode using a first photo-mask process;
    forming a gate insulating layer, an amorphous silicon layer, a doped amorphous silicon layer, and a source/drain metal layer on the substrate having the gate electrode and the pixel electrode;

forming a source electrode and a drain electrode using a second photo-mask process, the source electrode and the drain electrode defining a channel therebetween, the second photo-mask process comprising coating a photo-resist layer on the source/drain metal layer, exposing the photo-resist layer using a photo-mask comprising a slit, and developing the exposed photo-resist layer to form a photo-resist pattern having a groove;

forming a metal layer on the substrate and the pixel electrode;

forming a passivation material layer on the source electrode, the drain electrode, the channel, and the metal layer; and forming a passivation layer on the source electrode, the drain electrode and the channel and a metal contact layer using a third photo-mask process, the metal contact layer interconnecting the drain electrode and the pixel electrode.

2. The method as claimed in claim 1, wherein the first photo-mask process comprises coating a photo-resist layer on the gate metal layer, exposing the photo-resist layer using a first photo-mask, and developing the exposed photo-resist layer to form a photo-resist pattern.

3. The method as claimed in claim 2, wherein the first photo-mask process further comprises etching the gate metal layer and the transparent conductive layer using the photo-resist pattern as a mask to form the gate electrode and the pixel electrode, and removing the photo-resist pattern.

4. The method as claimed in claim 1, wherein the second photo-mask process further comprises melting the photo-resist pattern having the groove to form a planar photo-resist layer.

5. The method as claimed in claim 1, wherein the second photo-mask process further comprises removing the photo-resist pattern having the groove, coating another photo-resist layer, exposing said another photo-resist layer from a back of the substrate using the gate electrode, the source electrode and the drain electrode as masks, and developing the exposed said another photo-resist layer to form a planar photo-resist layer.

6. The method as claimed in claim 1, wherein the substrate is made from glass or quartz.

7. The method as claimed in claim 1, wherein the transparent conductive layer is made from indium tin oxide or indium zinc oxide.

8. The method as claimed in claim 1, wherein the gate metal layer is made from material including any one or more items selected from the group consisting of aluminum, molybdenum, copper, chromium, and tantalum.

9. The method as claimed in claim 1, wherein the source/drain metal layer is made from material including any one or more items selected from the group consisting of aluminum, aluminum alloy, molybdenum, tantalum, and molybdenum-tungsten alloy.

* * * * *